United States Patent
Kim et al.

(10) Patent No.: US 8,369,176 B2
(45) Date of Patent: Feb. 5, 2013

(54) MULTI-CHIP MEMORY DEVICE

(75) Inventors: Min Su Kim, Icheon-si (KR); Sung Hoon Ahn, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 188 days.

(21) Appl. No.: 12/826,615

(22) Filed: Jun. 29, 2010

(65) Prior Publication Data

US 2010/0328980 A1   Dec. 30, 2010

(30) Foreign Application Priority Data

Jun. 29, 2009   (KR) .................. 10-2009-0058473

(51) Int. Cl.
*G11C 5/14* (2006.01)

(52) U.S. Cl. ..................................... 365/227; 365/189.2

(58) Field of Classification Search ................ 365/227, 365/189.2, 191; 438/109, 106, 107, 108
See application file for complete search history.

(56) References Cited

U.S. PATENT DOCUMENTS

| | | | |
|---|---|---|---|
| 6,991,964 B2 * | 1/2006 | Matsuo et al. | 438/109 |
| 2008/0212391 A1 * | 9/2008 | Sohn et al. | 365/227 |
| 2008/0311684 A1 * | 12/2008 | Tu et al. | 438/4 |

FOREIGN PATENT DOCUMENTS

KR   1020090056259 A   3/2009

* cited by examiner

*Primary Examiner* — Vu Le
(74) *Attorney, Agent, or Firm* — William Park & Associates Ltd.

(57) ABSTRACT

A multi-chip memory device includes a number of chips and a control circuit included in each of the chips and configured to generate an internal chip enable signal in response to set data stored therein and an external chip enable signal

17 Claims, 2 Drawing Sheets

121

122

MULTI-CHIP MEMORY DEVICE

CROSS-REFERENCE TO RELATED APPLICATION

Priority to Korean patent application number 10-2009-0058473 filed on Jun. 29, 2009, the entire disclosure of which is incorporated by reference herein, is claimed.

BACKGROUND

Exemplary embodiments relate to a multi-chip memory device, and more particularly to a multi-chip memory device which is capable of improving efficiency by operating only the remaining chips if some chips fail.

Size and weight of electronic devices are getting smaller and lighter in line with the technological developments in the semiconductor industry in response to the customer needs. One technique for meeting such needs in the semiconductor industry is the multi-chip packaging technique. The multi-chip packaging technique as implied by the name is a technique for forming a package having a plurality of semiconductor chips within it. Use of a multi-chip package provides advantages in terms of smaller size, lighter weight, and reduced mounting area as compared to use of several packages each having one semiconductor chip packaged therein.

When one or more chips in a conventional multi-chip package fail, all chips in the package including those that did not fail end up being not used due to problems existing in the process. For example, in a multi-chip memory device having four chips 1CE to 4CE packaged therein, even if only one of the chips 1CE to 4CE were to fail, the entire multi-chip memory device including the chips 1CE to 4CE is treated as a fail.

BRIEF SUMMARY

Exemplary embodiments relate to a multi-chip memory device in which, if one or more of multiple chips fail, the failed chips are disabled and not used on the basis of fail information stored in a content-addressable memory (CAM) cell and only the remaining normal chips are enabled and used, thereby being capable of improving efficiency.

A multi-chip memory device according to an aspect of the present disclosure comprises a number of chips and a control circuit included in each of the chips and configured to generate an internal chip enable signal in response to set data therein and an external chip enable signal The internal chip enable signal, supplied to a chip determined to be a fail from among the chips, is inactivated on the basis of the set data.

The control circuit comprises a content-addressable memory (CAM) cell unit configured to store the set data and a signal control unit configured to generate the internal chip enable signal in response to the set data and the external chip enable signal and to generate an internal front-back signal in response to the set data and an external front-back signal.

The signal control unit comprises a chip enable signal controller configured to generate the internal chip enable signal, in response to the set data and the external chip enable signal, and a front-back signal controller configured to generate the internal front-back signal, in response to the set data and the external front-back signal.

The chip enable signal controller of a chip determined to be a fail, from among the chips, outputs the internal chip enable signal which is inactivated irrespective of the external chip enable signal.

The chip enable signal controller comprises a transistor coupled between a power source voltage terminal and an output node and configured to generate a controlled voltage through the output node on the basis of the set data and a logic device configured to generate the internal chip enable signal by logically combining the external chip enable signal and the voltage of the output node.

The front-back signal controller comprises an inverter configured to invert the set data and output an inverted result and a logic device configured to generate the internal front-back signal by logically combining the external front-back signal and the inverted result output by the inverter.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
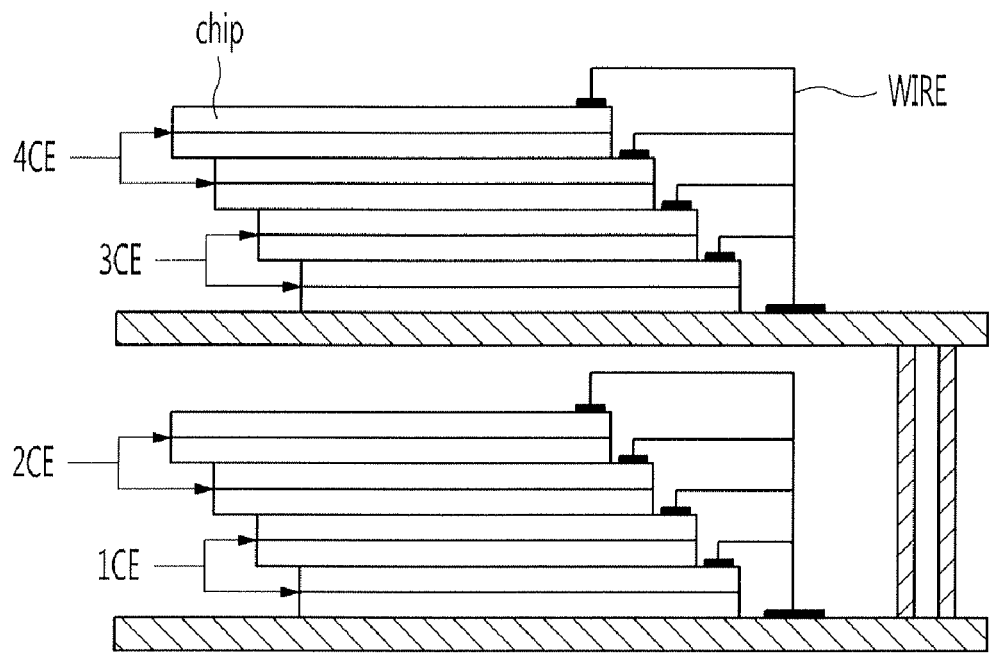
FIG. 1 shows general construction of a multi-chip memory device according to an embodiment of this disclosure.

FIG. 1 shows the construction of a multi-chip memory device according to an embodiment of this disclosure Referring to FIG. 1, the multi-chip memory device according to an embodiment of the present disclosure has a structure in which a number of chip sets 1CE to 4CE are stacked. Each chip set is comprised of two chips in which the front side of one chip is adhered to the rear side of another chip. Furthermore, the pad portion of each chip set is coupled to an external pad through a bonding wire.

Figure 2:
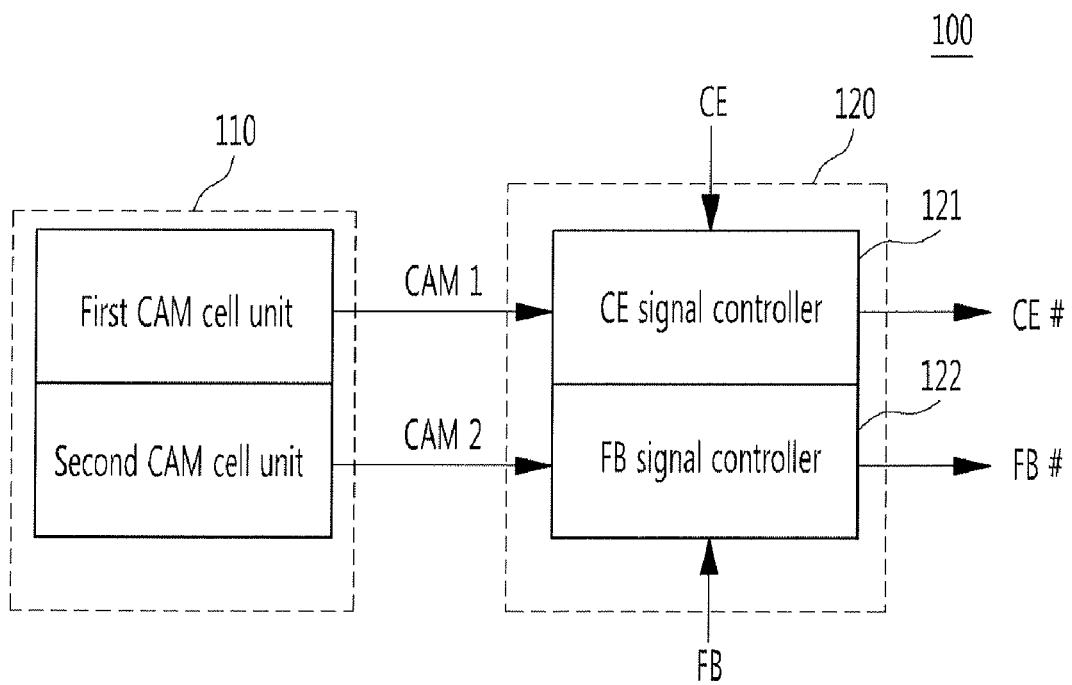
FIG. 2 shows the construction of a control circuit included in each of the chips in the multi-chip memory device according to an embodiment of this disclosure.

FIG. 2 shows the construction of a control circuit included in each of the chips of the multi-chip memory device according to an embodiment of this disclosure.

Referring to FIG. 2, the control circuit 100 included in each of the chips of the multi-chip memory device includes a signal control unit 120 and a content-addressable memory (CAM) cell circuit 110 including first and second CAM cell units.

The first CAM cell unit of the CAM cell unit 110 stores fail information about a chip and outputs first CAM data CAM1 including the data about whether a chip is a fail or not. The second CAM cell unit stores fail information about a chip and outputs second CAM data CAM2 including the data about whether a chip is a fail or not.

The signal control unit 120 includes a chip enable (CE) signal controller 121 and a front-back (FB) signal controller 122.

The CE signal controller 121 outputs an internal chip enable signal CE#, enabling or disabling a corresponding chip, in response to the first CAM data CAM1 and a chip enable signal received through the external pad.

The FB signal controller 122 outputs an internal front back (FB) signal FB#, enabling or disabling a corresponding chip, in response to the second CAM data CAM2 and a front-back signal received through the external pad.

Figure 3:
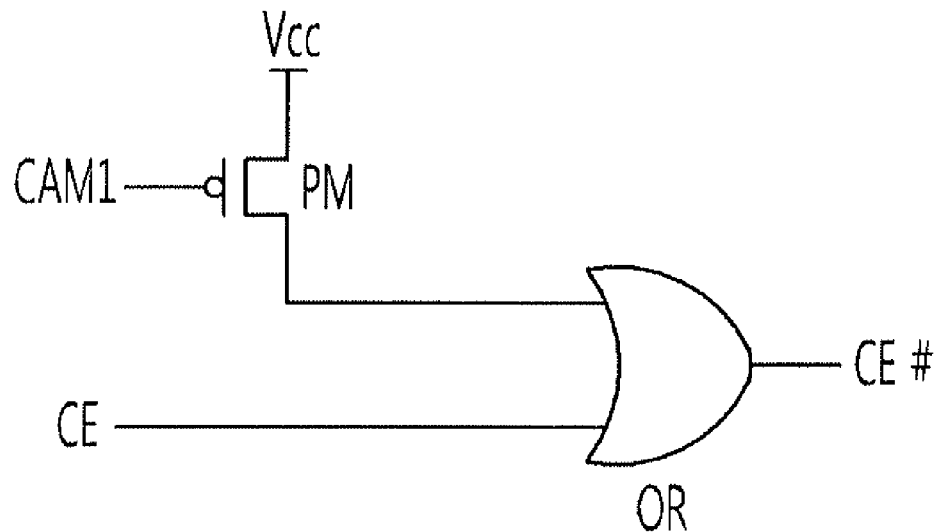
FIG. 3 is a detailed circuit diagram of a chip enable (CE) signal controller.

FIG. 3 is a detailed circuit diagram of the CE signal controller 121.

Referring to FIG. 3, the CE signal controller 121 includes a transistor PM and an OR gate OR.

The transistor PM is coupled between a power source voltage terminal Vcc and the input node of the OR gate OR. The transistor PM supplies a signal of a power source voltage (Vcc) level to the OR gate OR or blocks the supply of the signal to the OR gate OR, on the basis of the first CAM data CAM1 received from the first CAM cell unit. The OR gate OR logically combines a chip enable signal CE, received through the external pad, and the output signal of the transistor PM and generates the internal chip enable signal CE#.

Although not shown, the internal chip enable signal CE# is supplied to the internal circuits of a chip, thus activating the chip.

Figure 4:
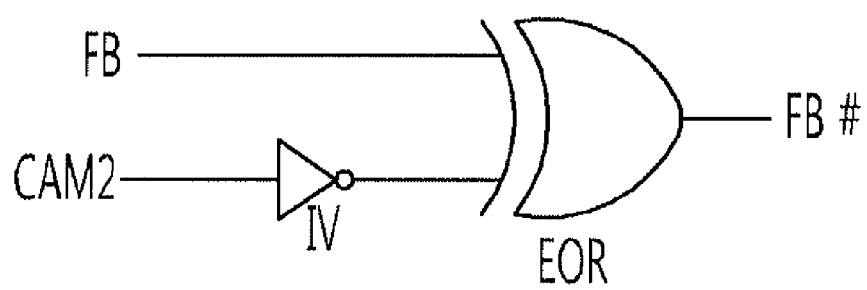
FIG. 4 is a detailed circuit diagram of a front-back (FB) signal controller.

FIG. 4 is a detailed circuit diagram of the FB signal controller 122.

Referring to FIG. 4, the FB signal controller 122 includes an inverter IV and an exclusive OR gate EOR. The inverter IV inverts the second CAM data CAM2 received from the second CAM cell unit and outputs the inverted second CAM data CAM2 to the input node of the exclusive OR gate EOR. The exclusive OR gate EOR logically combines the inverted second CAM data CAM2 and the front-back signal FB received through the external pad and generates the internal front-back signal FB#. Although not shown, in a package including a pair of chips, the front-back signal FB# is supplied to the internal circuits of a chip selected from the two chips, thus activating the chip.

A method of operating the multi-chip memory device according to an embodiment of this disclosure is described below with reference to FIGS. 1 to 4.

A test operation is performed on a fabricated multi-chip memory device in order to check whether any one of the chip sets CE1 to CE4 has failed. Fail test data for each of the chip sets is stored in the CAM cell unit 110. For example, assuming that the second and third chip sets CE2, CE3 among the chip sets CE1 to CE4 have failed, a program operation is performed on the CAM cell unit 110 for each of the chip sets CE1 to CE4 so that a normal data value would be stored in the CAM cell unit 110 for each of the first and fourth chip sets CE1, CE4, and a test error data value would be stored in the CAM cell unit 110 for each of the second and third chip sets CE2, CE3.

The operations of the multi-chip memory device including program and read operations are described in detail below.

First, the chip enable signal CE is provided to the chip sets CE1 to CE4 through an external pad.

The CE signal controller 121 of each chip generates the internal chip enable signal CE# in response to the externally provided chip enable signal CE and the first CAM cell data CAM1 programmed on the basis of the test result of the corresponding chip, which is stored in the first CAM cell unit.

For example, in case the corresponding chip is determined to be a normal chip as a result of the test from which a normal data value is stored in the CAM cell unit 110 of the corresponding chip, the transistor PM of the CE signal controller 121 blocks the supply of the power source voltage Vcc to the input node of the OR gate OR on the basis of the first CAM cell data CAM1 of a high level outputted by the first CAM cell unit. The OR gate OR outputs the internal chip enable signal CE# activated to a low level in response to the chip enable signal CE activated to a low level and the output signal of the transistor PM. The internal chip enable signal CE# is provided to the internal circuits of the corresponding chip, thus activating the chip.

For another example, in case the corresponding chip is determined to be a fail chip as a result of the test from which a fail data value is stored in the CAM cell unit 110 of the corresponding chip, the transistor PM of the CE signal controller 121 supplies the power source voltage Vcc to the input node of the OR gate OR on the basis of the first CAM cell data CAM1 of a low level outputted by the first CAM cell unit. Accordingly, the OR gate OR outputs the internal chip enable signal CE# inactivated to a high level in response to the chip enable signal CE activated to a low level and the output signal of the transistor PM. The internal chip enable signal CE# is supplied to the internal circuits of the corresponding chip, thus activating the chip.

That is, in case the corresponding chip is determined to be a normal chip as a result of the test and a normal data value is therefore stored in the CAM cell unit 110 of the corresponding chip, the internal chip enable signal CE# is controlled in response to the chip enable signal CE received through the external pad. On the other hand, in case the corresponding chip is determined to be a fail chip as a result of the test and a fail data value is stored in the CAM cell unit 110 of the corresponding chip, the internal chip enable signal CE# is in a disable state (for example, a high level).

The FB signal controller 122 generates the internal front-back signal FB# in response to the front-back signal FB and the second CAM cell data CAM2 programmed based on the test result of the corresponding chip, which is stored in the second CAM cell unit.

For example, in case the corresponding chip is determined to be a normal chip as a result of the test from which a normal data value is stored in the CAM cell unit 110 of the corresponding chip, the inverter IV of the FB signal controller 122 supplies an output signal of a low level to the input node of the exclusive OR gate EOR on the basis of the second CAM cell data CAM2 of a high level, outputted by the second CAM cell unit. Accordingly, the exclusive OR gate EOR outputs the internal front-back signal FB# having the same logic level as the front-back signal FB in response to the front-back signal FB activated to a high level or a low level.

For another example, in case the corresponding chip is determined to be a fail chip as a result of the test from which a fail data value is stored in the CAM cell unit 110 of the corresponding chip, the inverter IV of the FB signal controller 122 supplies an output signal of a high level to the input node of the exclusive OR gate EOR on the basis of the second CAM cell data CAM2 of a low level, outputted by the second CAM cell unit. Accordingly, the exclusive OR gate EOR outputs the internal front-back signal FB# having an opposite logic level to the front-back signal FB in response to the front-back signal FB activated to a high level or a low level.

According to an embodiment of this disclosure as described above, if one or more chips in a multi-chip memory device are determined to be in a fail state, only those corresponding failed chips can be disabled while the remaining chips are enabled such that the multi-chip memory device can still be used albeit at a reduced capacity. Accordingly, the efficiency of the memory device can be improved. Table 1 below is a signal enable table illustrating a method of activating and using first and fourth dies in the case in which, in a 4CE QD-DSP chip having eight dies, the remaining dies except the first and fourth dies are determined to be a fail as a result of a test.

TABLE 1

| | PAD IN CHIP | | | | | PKG PIN |
|---|---|---|---|---|---|---|
| | FB# | IE#0 | IE#1 | CE#0 | CE#1 | CE# |
| 1$^{st}$ Die | Vss | Vssq | NC | Enable | Disable | CE#0 |
| 2$^{nd}$ Die | Vcc | Vssq | NC | High | Disable | CE#0 |
| 3$^{rd}$ Die | Vss | Vssq | NC | High | Disable | CE#1 |
| 4$^{th}$ Die | Vcc→Vss | Vssq | NC | Enable | Disable | CE#1 |
| 5$^{th}$ Die | Vss | NC | Vssq | Disable | High | CE#2 |
| 6$^{th}$ Die | Vcc | NC | Vssq | disable | High | CE#2 |
| 7$^{th}$ Die | Vss | NC | Vssq | disable | High | CE#3 |
| 8$^{th}$ Die | Vcc | NC | Vssq | disable | High | CE#3 |

Referring to Table 1, in case all dies except the first and fourth dies are determined to have failed as a result of the test, in the first die, the chip enable signal CE#0 is activated, and the internal front-back signal FB# has a ground voltage Vss. Thus, the first die is set up to a front chip. In the fourth die, the internal front-back signal FB# shifts from the power source voltage Vcc to the ground voltage Vss. Thus, the fourth die is set up to a front chip. Accordingly, the first and fourth dies are activated and can be used as a 2CE DDP chip. Furthermore, the chip enable signals CE#0, CE#1 of a high level is supplied to the remaining dies, thus inactivating the remaining dies.

In accordance with an embodiment of this disclosure, in case one or more chips included in a multi-chip memory device are determined to have failed, the failed chips are disabled and not used on the basis of fail information stored in the respective CAM cell units, and only the remaining normal chips are enabled and used. Accordingly, the efficiency of the multi-chip memory device can be improved.

What is claimed is:

1. A multi-chip memory device, comprising:
  a number of chips; and
  a control circuit included in each of the chips and configured to generate an internal chip enable signal in response to a set data stored in the control circuit and an external chip enable signal and to generate an internal front-back signal in response to the set data and an external front-back signal.

2. The multi-chip memory device of claim 1, wherein the internal chip enable signal for a failed chip among the number of chips is inactivated on a basis of the set data stored in the control circuit of the failed chip.

3. The multi-chip memory device of claim 1, wherein the control circuit comprises:
  a content-addressable memory (CAM) cell unit configured to store the set data; and
  a signal control unit configured to generate the internal chip enable signal in response to the set data and the external chip enable signal and to generate the internal front-back signal in response to the set data and the external front-back signal.

4. The multi-chip memory device of claim 3, wherein the signal control unit comprises:
  a chip enable signal controller configured to generate the internal chip enable signal in response to the set data and the external chip enable signal; and
  a front-back signal controller configured to generate the internal front-back signal in response to the set data and the external front-back signal.

5. The multi-chip memory device of claim 4, wherein the chip enable signal controller of a failed chip among the number of chips outputs the internal chip enable signal which is inactivated irrespective of the external chip enable signal.

6. The multi-chip memory device of claim 4, wherein the chip enable signal controller comprises:
  a transistor coupled between a power source voltage terminal and an output node and configured to generate a controlled voltage through the output node on a basis of the set data; and
  a logic device configured to generate the internal chip enable signal by logically combining the external chip enable signal and the voltage of the output node.

7. The multi-chip memory device of claim 6, wherein the logic device is an OR gate.

8. The multi-chip memory device of claim 4, wherein the front-back signal controller comprises:
  an inverter configured to invert the set data and output an inverted result; and
  a logic device configured to generate the internal front-back signal by logically combining the external front-back signal and the inverted result output by the inverter.

9. The multi-chip memory device of claim 6, wherein the logic device is an Exclusive OR gate.

10. A multi-chip memory device including a number of chips, the multi-chip memory device comprising:
  a storage unit configured to store fail information of each chip;
  a first signal controller configured to generate an internal chip enable signal in response to the stored fail information and an external chip enable signal; and
  a second signal controller configured to generate an internal front-back signal in response to the stored fail information and an external front-back signal.

11. The multi-chip memory device of claim 10, wherein the internal chip enable signal generated by the first signal controller of a failed chip among the number of chips is inactivated on a basis of the fail information in the storage unit.

12. The multi-chip memory device of claim 10, wherein the storage unit comprises a CAM cell unit for storing the fail information about each chip.

13. The multi-chip memory device of claim 10, wherein the first signal controller of a failed chip among the number of chips outputs the internal chip enable signal which is inactivated irrespective of the external chip enable signal.

14. The multi-chip memory device of claim 10, wherein the first signal controller comprises:
  a transistor coupled between a power source voltage terminal and an output node and configured to generate a controlled voltage through the output node on a basis of the fail information; and
  a logic device configured to generate the internal chip enable signal by logically combining the external chip enable signal and the voltage of the output node.

15. The multi-chip memory device of claim 14, wherein the logic device is an OR gate.

16. The multi-chip memory device of claim 10, wherein the second signal controller comprises:
  an inverter configured to invert the fail information and output an inverted result; and
  a logic device configured to generate the internal front-back signal by logically combining the external front-back signal and the inverted result output by the inverter.

17. The multi-chip memory device of claim 16, wherein the logic device is an Exclusive OR gate.

* * * * *